(12) United States Patent
Ikeda et al.

(10) Patent No.: US 7,243,422 B2
(45) Date of Patent: Jul. 17, 2007

(54) APPARATUS FOR PRESS-FITTING

(75) Inventors: Yuji Ikeda, Kanagawa (JP); Kiyomi Maruyama, Kanagawa (JP)

(73) Assignee: Tyco Electronics AMP K.K., Kanagawa (JP)

( * ) Notice: Subject to any disclaimer, the term of this patent is extended or adjusted under 35 U.S.C. 154(b) by 387 days.

(21) Appl. No.: 10/851,725

(22) Filed: May 21, 2004

(65) Prior Publication Data
US 2005/0003687 A1    Jan. 6, 2005

(30) Foreign Application Priority Data
May 23, 2003    (JP)    ............... 2003-146596

(51) Int. Cl.
*H01R 9/00*    (2006.01)
*H05K 3/00*    (2006.01)
(52) U.S. Cl. .............. 29/845; 29/739; 29/741; 29/747; 29/751; 29/753; 29/842; 29/33 M; 439/78; 439/79
(58) Field of Classification Search ............... 29/845, 29/739, 741, 747, 751, 753, 842, 33 M; 439/78, 439/79
See application file for complete search history.

(56) References Cited

U.S. PATENT DOCUMENTS 4,550,962 A * 11/1985 Czeschka ............ 439/78
4,871,321 A   10/1989 Johnson
5,509,192 A *  4/1996 Ota et al. ............ 29/741
6,083,032 A    7/2000 Daoud
2004/0115970 A1  6/2004 Sakata

FOREIGN PATENT DOCUMENTS

DE  103 57 224 A1  7/2004
JP  08-069828      3/1999
JP  2003-068419    3/2003
JP  2004-192976    7/2004

OTHER PUBLICATIONS

European Search Report dated Sep. 8, 2006 for Application No. EP 04 25 3016.

* cited by examiner

*Primary Examiner*—A. Dexter Tugbang
*Assistant Examiner*—Tim Phan
(74) *Attorney, Agent, or Firm*—Barley Snyder LLC

(57) ABSTRACT

An apparatus for positioning and press-fitting press-fit portions of roughly L-shaped legs of contacts arranged in multiple rows in a connector into a substrate includes a press-fitting head and an alignment plate. The press-fitting head is rotatable between a rest position and a press-fitting position and has vertical grooves for receiving the contacts in the press-fitting position. The alignment plate is arranged proximate the press-fitting head when the press-fitting head is in the press-fitting position and aligns the press-fit portions of the contacts with press-fitting apertures in the substrate. The alignment plate is retracted from the press-fitting head when the press-fitting head press-fits the press-fit portions into the substrate.

10 Claims, 12 Drawing Sheets

APPARATUS FOR PRESS-FITTING

CROSS-REFERENCE TO RELATED APPLICATIONS

This application claims the benefit of the filing date under 35 U.S.C. § 119(a)–(d) of Japanese Patent Application No. 2003-146596, filed May 23, 2003.

FIELD OF THE INVENTION

The invention relates to an apparatus having a press-fitting head that positions roughly L-shaped legs of contacts that are arranged in multiple rows in a connector and press-fits press-fit portions of the roughly L-shaped legs into a connector substrate. The invention further relates to a method for press-fitting utilizing the press-fitting head.

BACKGROUND OF THE INVENTION

It is well known to press-fit contacts in a connector with multiple rows of contacts having roughly L-shaped legs that overlap in a vertical direction with corresponding contacts in a different row into a substrate. When press-fitting the contacts of the connector into the substrate, the contacts arranged in a top row can be pressed from above, however, the contacts arranged in a lower row cannot be pressed from above because the contacts arranged in the top row get in the way.

A solution to this problem is proposed in Japanese Patent Laid-Open No. 2003-68419. This reference teaches a press-fitting jig with a comb-shaped portion having vertical and horizontal grooves. The vertical grooves have a pitch the same as an arrangement pitch of the contacts. A pair consisting of an upper and a lower contact enters each of the vertical grooves so that each pair of upper and lower contacts is fit into each vertical groove in the press-fitting jig. The press-fitting jig or the connector is then moved slightly relative to the arrangement direction of the contacts so that the horizontal grooves receive the upper and lower contacts. As a result, walls of the press-fitting jig are positioned adjacent to both the upper and lower contacts, which allows the press-fitting jig to press downward on all of the contacts in the connector when press-fitting the contacts into a substrate.

Another solution to the problem is proposed in Japanese Patent Laid-Open No. 8-69828. This reference teaches pressing a somewhat wide shoulder section formed on each of the contacts. Although the upper and lower contacts overlap on the whole, the shoulder sections of the contacts are formed in such a way that the shoulder sections do not overlap. For example, the shoulder sections of the lower contacts could be formed to stick out from the shoulder sections of the upper contacts when viewed from above. It is therefore possible to press down the shoulder sections of all the contacts at the same time to press-fit all the contacts of the connector into a substrate.

The technique disclosed in Japanese Patent Laid-Open No. 2003-68419 press-fits the contacts into the substrate when the contacts are engaged with the vertical and horizontal grooves of the press-fitting jig. Since the vertical and horizontal grooves are connected to each other, if one of the lower contacts disengages from one of the horizontal grooves due to, for example, misalignment or bending, the corresponding upper contact can not be pressed, which may result in an improper press-fit. Additionally, since the portion pressed and the portion actually fitted are fairly distant from each other, especially in the case of the upper contacts, if any of the upper contacts are bent even slightly, the contact may buckle in the middle when pressed. Further, although not disclosed, a terminal alignment plate is used to position the contacts with press-fitting apertures in the substrate. The terminal alignment plate is attached to a bottom of the connector and is press-fit into the substrate. The terminal alignment plate remains fitted in the substrate together with the press-fitted connector, although it is no longer necessary, increasing the cost of the assembly.

On the other hand, the technique disclosed in Japanese Patent Laid-Open No. 8-69828 has the advantage of being able to install the shoulder sections in such a way as to be visible from above, and the contacts are press-fit simply by moving the press-fitting jig vertically. Additionally, the shoulder sections prevent buckling because the shoulder sections are installed at a position close to the portion actually press-fitted. However, a slight displacement or bend of the contact will cause the shoulder section of the contact to deviate from the position where it should be pressed, which makes it difficult for the press-fitting jig to properly press the contact. Also, Japanese Patent Laid-Open No. 8-69828 is silent as to the positioning between the contacts and the press-fitting apertures in the substrate. It is therefore assumed that it is necessary to use a terminal alignment plate, as previously described, that remains in the substrate each time a connector is press-fitted.

SUMMARY OF THE INVENTION

It is therefore an object of the present invention to provide a press-fitting head that can reliably press-fit a connector holding multiple rows of contacts into a substrate, an apparatus equipped with the press-fitting head, and a method for press-fitting that can press-fit the connector reliably into the substrate and reduce manufacturing costs.

This and other objects are achieved by an apparatus for positioning and press-fitting press-fit portions of roughly L-shaped legs of contacts arranged in multiple rows in a connector into a substrate comprising a press-fitting head and an alignment plate. The press-fitting head rotates between a rest position and a press-fitting position, and has vertical grooves for receiving the contacts in the press-fitting position. The alignment plate is arranged proximate the press-fitting head at a positioning site when the press-fitting head is in the press-fitting position. The alignment plate is retractable from the positioning site when the press-fitting head is in the press-fitting position.

This and other objects are further achieved by a press-fitting head for positioning and press-fitting press-fit portions of roughly L-shaped legs of contacts arranged in multiple rows in a connector into a substrate comprising vertical grooves for receiving the contacts. The vertical grooves have abutment portions and first and second positioning walls. The abutment portions extend substantially perpendicular to the vertical grooves for abutting shoulders of the contacts. The first and second positioning walls are formed below the abutment portions and extend substantially perpendicular thereto for positioning the shoulders of the contacts in a right-left and forward-rearward direction.

This and other objects are still further achieved by a method for positioning and press-fitting press-fit portions of roughly L-shaped legs of contacts arranged in multiple rows in a connector into a substrate. The method includes mounting a substrate on a substrate mounting section, inserting the roughly L-shaped legs of the contacts into apertures in an alignment plate, mounting the connector on a connector mounting section, placing a press-fitting head over the legs of the contacts, retracting the alignment plate from the positioning site, and press-fitting the legs into press-fit apertures in the substrate by moving the press-fitting head toward the substrate.

BRIEF DESCRIPTION OF THE DRAWINGS

FIG. 1 is a schematic diagram showing a press-fitting head and a connector press-fitted into a substrate by the press-fitting head according to an embodiment of the present invention, wherein FIG. 1(a) is a front view and FIG. 1(b) is a side view;

FIG. 2 is a partially enlarged schematic diagram of the press-fitting head and connector shown in FIG. 1 showing the connector press-fitted into press-fitting apertures in the substrate, wherein FIG. 2(a) is a front view and FIG. 2(b) is a side view;

DETAILED DESCRIPTION OF THE INVENTION

Figure 1:
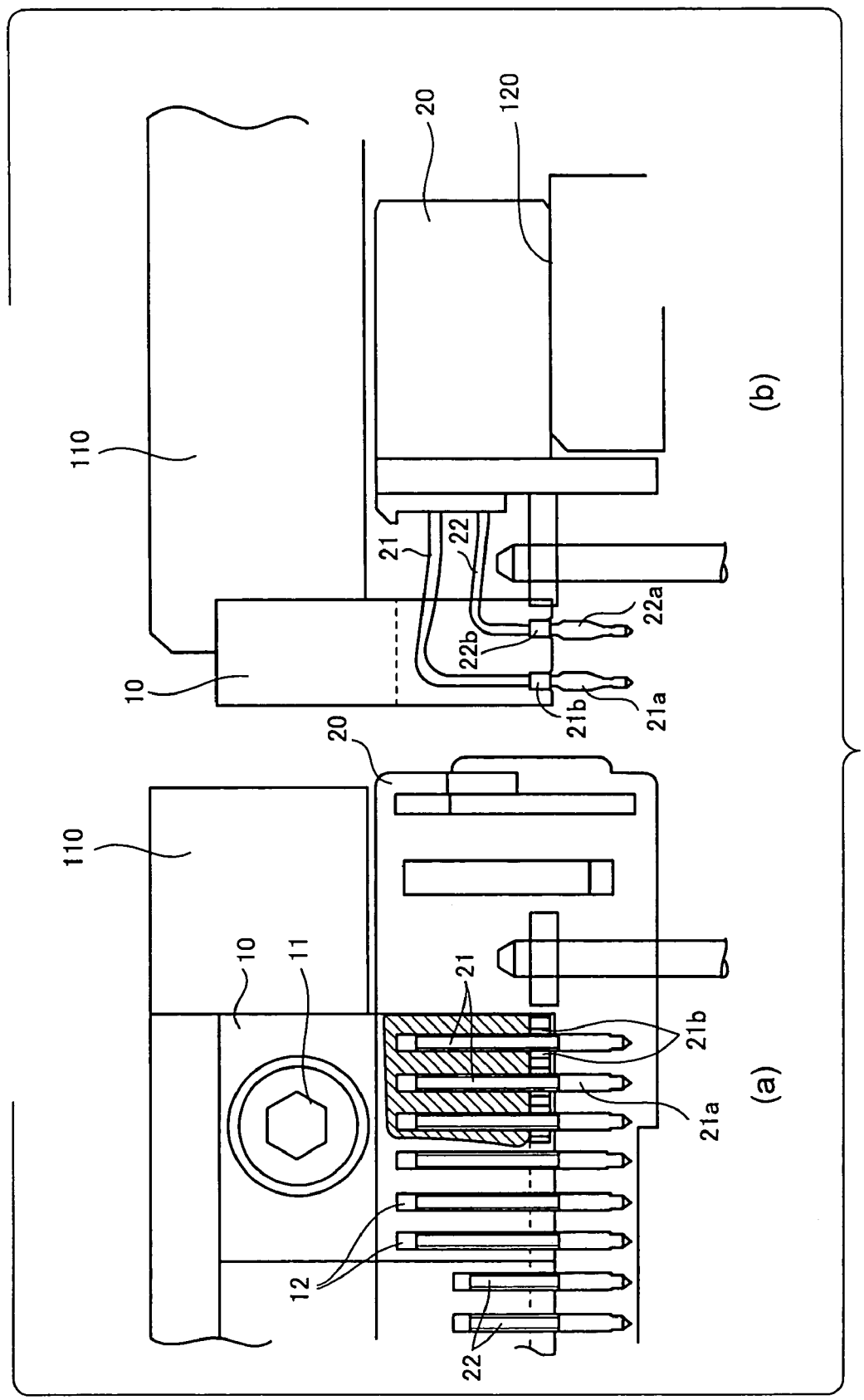
Figure 2:
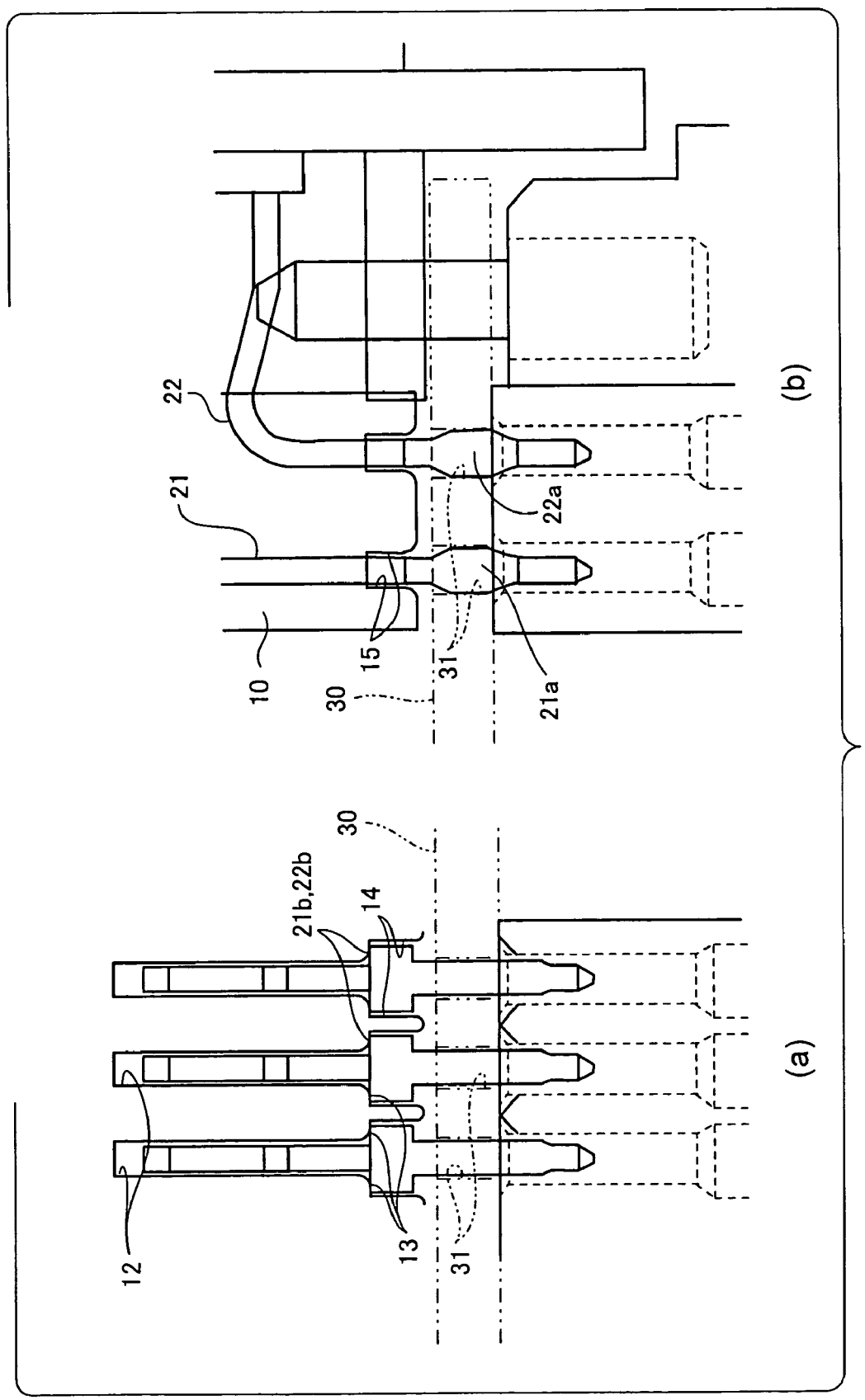

FIGS. 1(a)–(b) and 2(a)–(b) show a press-fitting head 10 and a connector 20 having contacts 21, 22 press-fitted into a substrate 30 by the press-fitting head 10 according to an embodiment of the present invention. As shown in FIG. 1(b), the connector 20 has upper and lower rows of roughly L-shaped contacts 21, 22. The contacts 21, 22 overlap vertically, and a large number of contacts are arranged with a predetermined pitch in a direction perpendicular to the paper in FIG. 1(b). At a bottom of the contacts 21, 22 are press-fit portions 21a, 22a that are press-fitted into press-fitting apertures 31 of the substrate 30, as shown in FIGS. 2(a)–(b). Slightly above the press-fit portions 21a, 22a are shoulders 21b, 22b that extend outward in a direction of width of the contacts 21, 22.

As shown in FIG. 2(a), the press-fitting head 10 has vertical grooves 12 formed with the same pitch as the predetermined pitch of the contacts 21, 22. The vertical grooves 12 have abutment portions 13 substantially perpendicular to the vertical grooves formed facing the shoulders 21b, 22b of the contacts 21, 22. Just below the abutment portions 13 are first positioning walls 14 and second positioning walls 15 extending substantially perpendicular to the abutment portions. The first positioning walls 14 position the shoulders 21b, 22b in a right-and-left direction of the contacts 21, 22, as shown in FIG. 2(a). The second positioning walls 15 position the shoulders 21b, 22b in a forward-and-backward direction, as shown in FIG. 2(b).

A method of press-fitting the contacts 21, 22 of the connector 20 with the press-fitting head 10 will now be described in greater detail.

Figure 3:
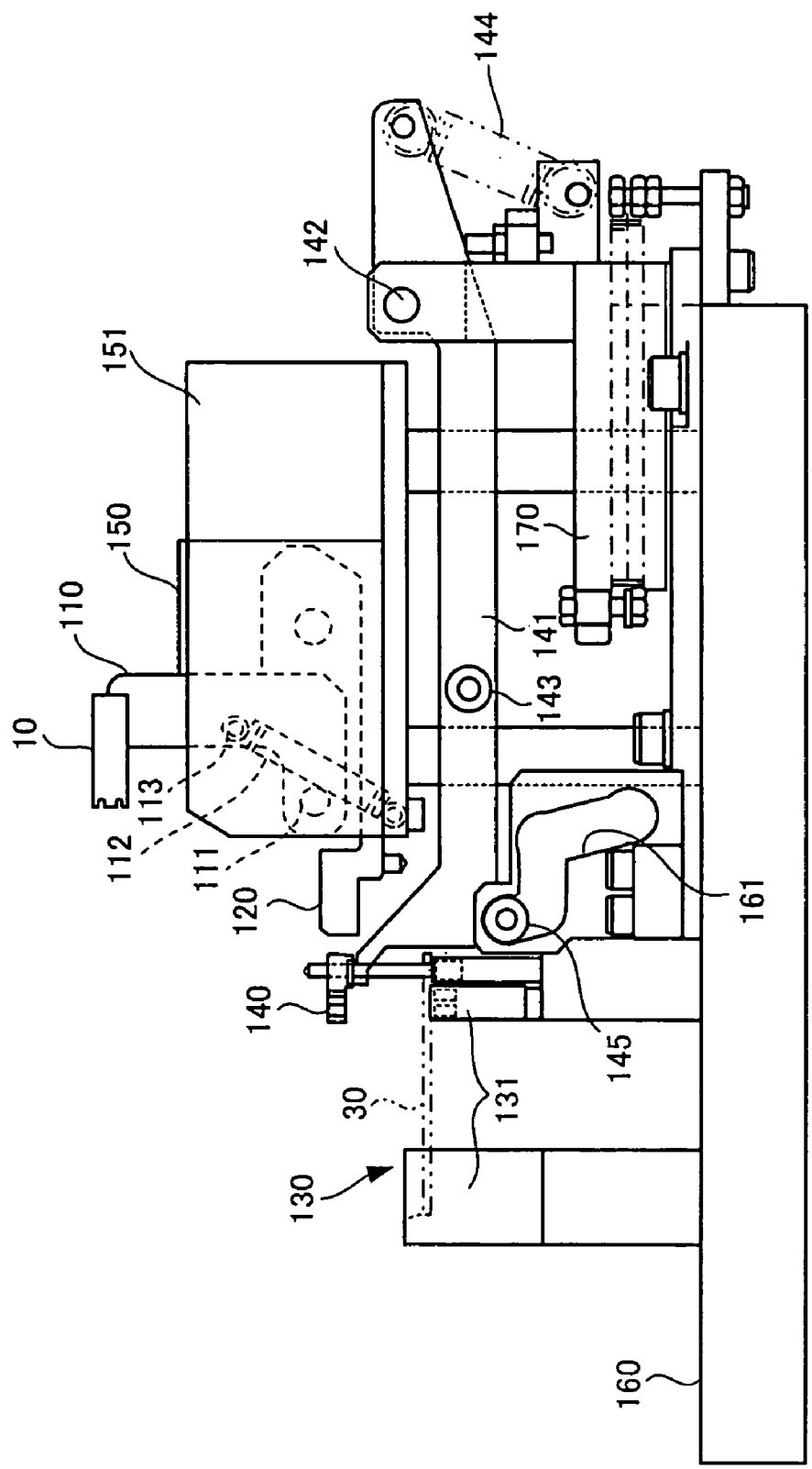
FIG. 3 is a side view of a press-fitting apparatus showing a step of the pressing operation.

As shown in FIG. 3, the substrate 30 is mounted on a board support 131 of a substrate mounting section 130. An alignment plate 140 is positioned proximate a connector mounting section 120 at what is referred to herein as a positioning site before the connector 20 is mounted on the connector mounting section 120. The alignment plate 140 is fastened to a tip of a link 141. The link 141 is rotatably supported by a rotating shaft 142 on a sliding board 170, which slides in the right-and-left direction in FIG. 3 with respect to a base 160. A cam groove 161 is cut in a member fastened to the base 160 and receives a cam pin 145 on the link 141 to form a cam mechanism. The cam mechanism is operated by a link control lever 143 and a link coil spring 144 both attached to the link 141. The link control lever 143 is manually operated by an operator who thereby performs part of the operation of the link 141.

Figure 5:
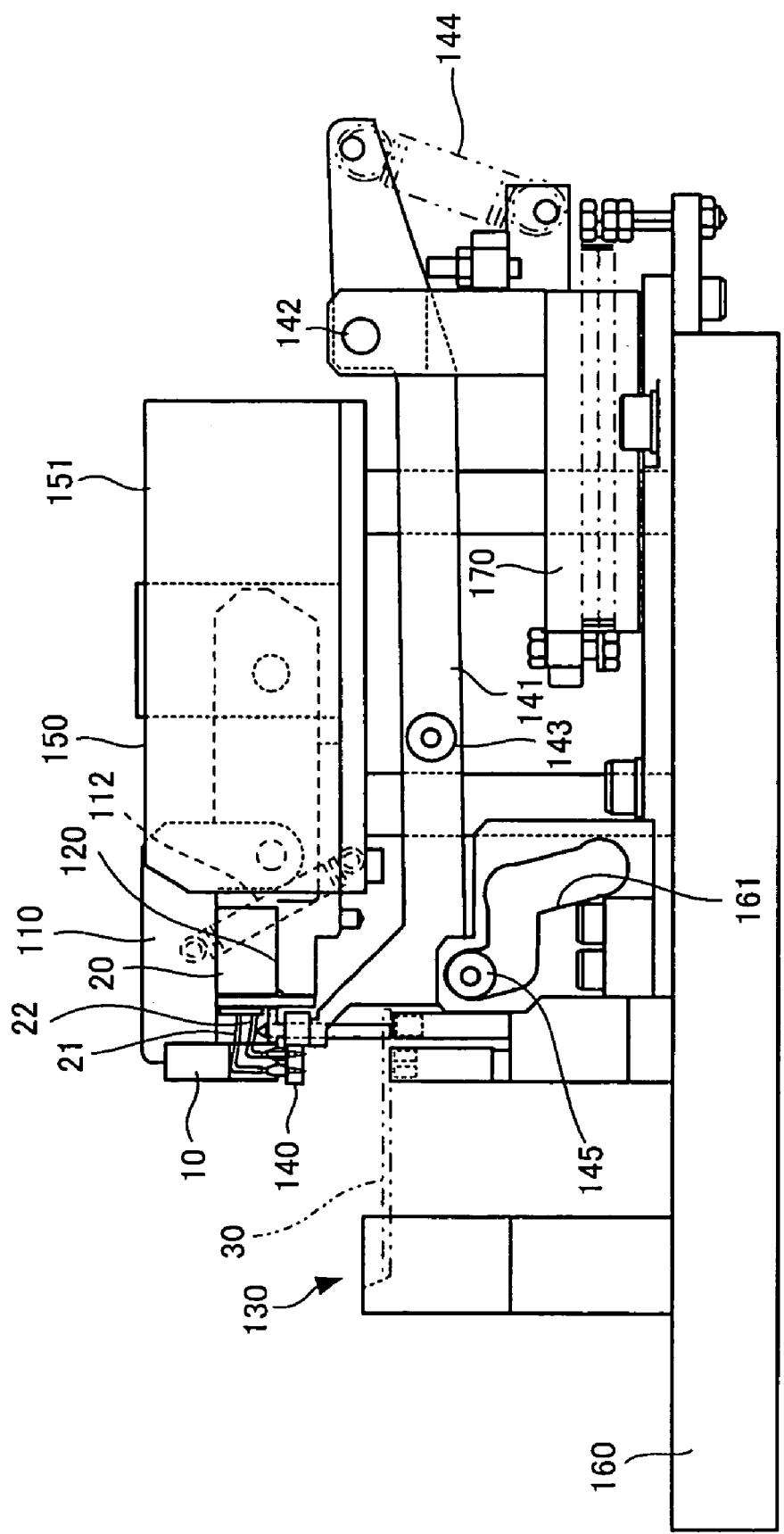
FIG. 5 is a side view of the press-fitting apparatus showing a step of the pressing operation.

As shown in FIG. 1(a), the press-fitting head 10 is secured to a support arm 110 by a bolt 11. As shown in FIG. 3, the support arm 110 is rotatably supported around a rotating shaft 111 by a support arm holder 150. The support arm 110 rotates between a rest position where the press-fitting head 10 is located as shown in FIG. 3 and a press-fitting position where the press-fitting head 10 is located as shown in FIG. 5. A coil spring 112 stabilizes the press-fitting head 10 at both the rest position and the press-fitting position. According to this embodiment, the press-fitting head 10 is rotated between the rest position and the press-fitting position by a manually operated control lever 113 that is attached to the support arm 110. The support arm 110 and support arm holder 150 are covered and supported by an upper base 151.

Figure 4:
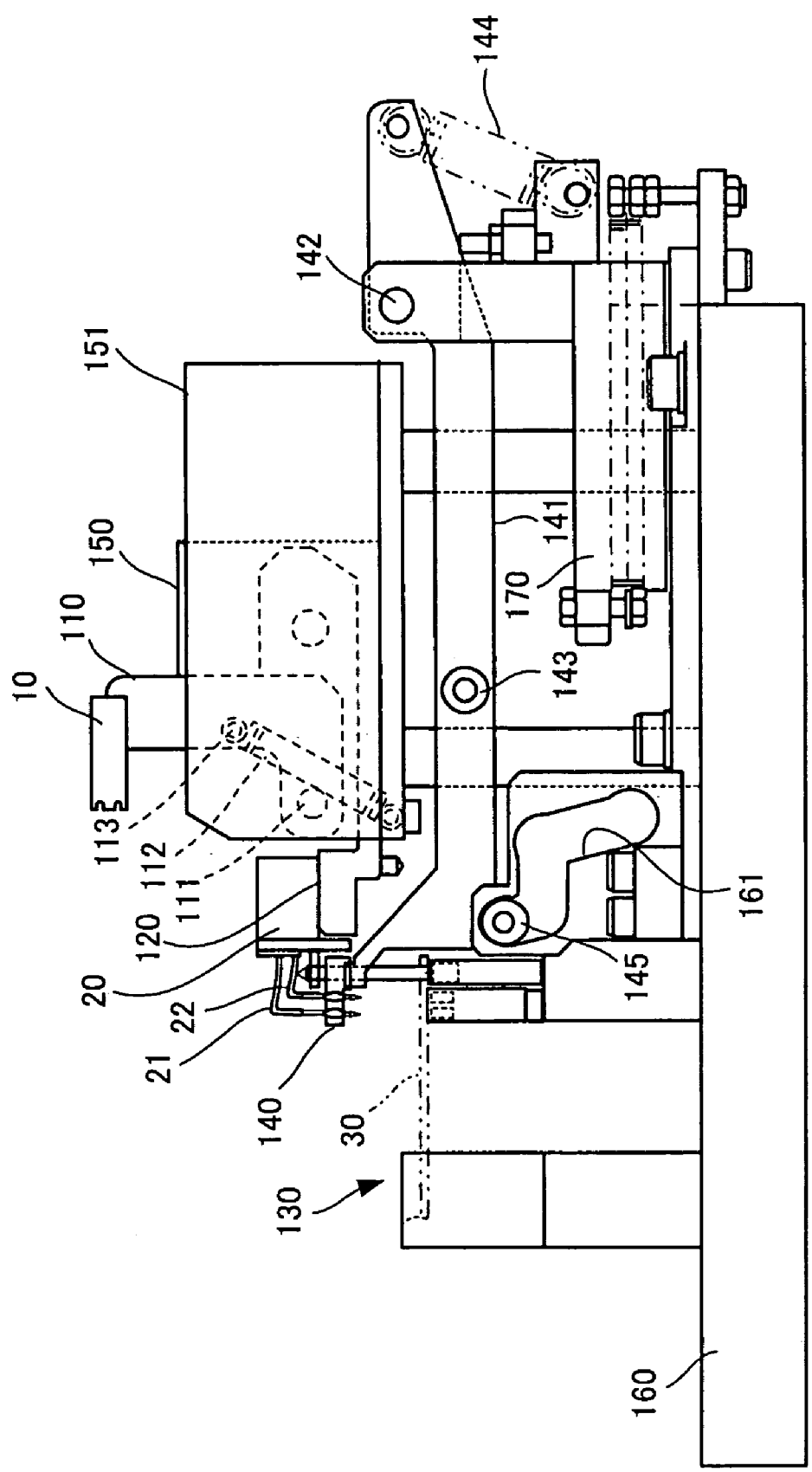
FIG. 4 is a side view of the press-fitting apparatus showing a step of the pressing operation.
Figure 9:
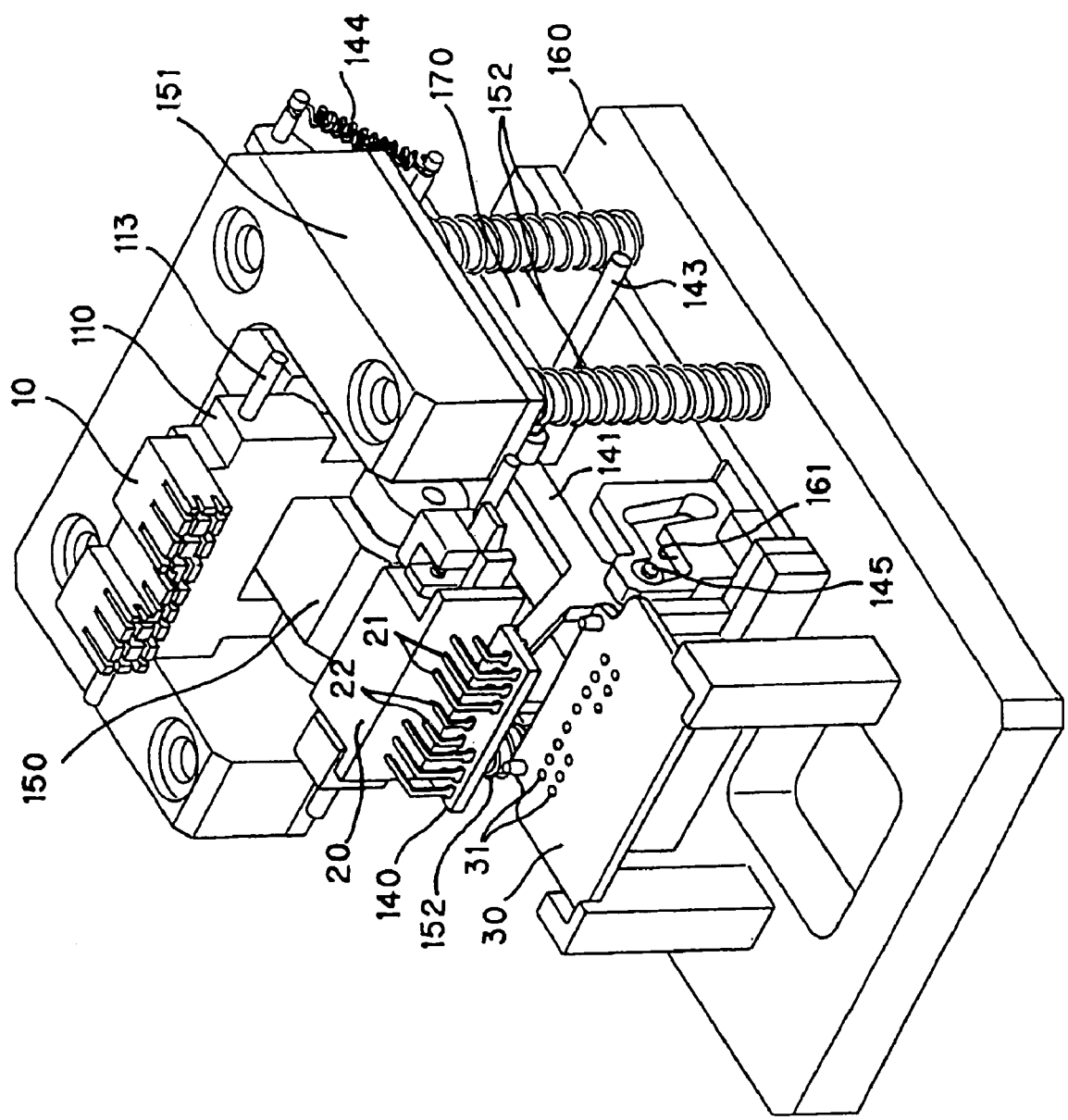
FIG. 9 is a perspective view of the press-fitting apparatus of FIG. 4.

When the press-fitting head 10 is in the rest position, the connector 20 is mounted on the connector mounting section 120, as shown in FIGS. 4 and 9. As best shown in FIG. 9, the contacts 21, 22 of the connector 20 are positioned by the alignment plate 140 at locations corresponding to the press-fitting apertures 31 of the substrate 30 into which the press-fit portions 21a, 22a of the contacts 21, 22 are to be press-fitted.

Figure 10:
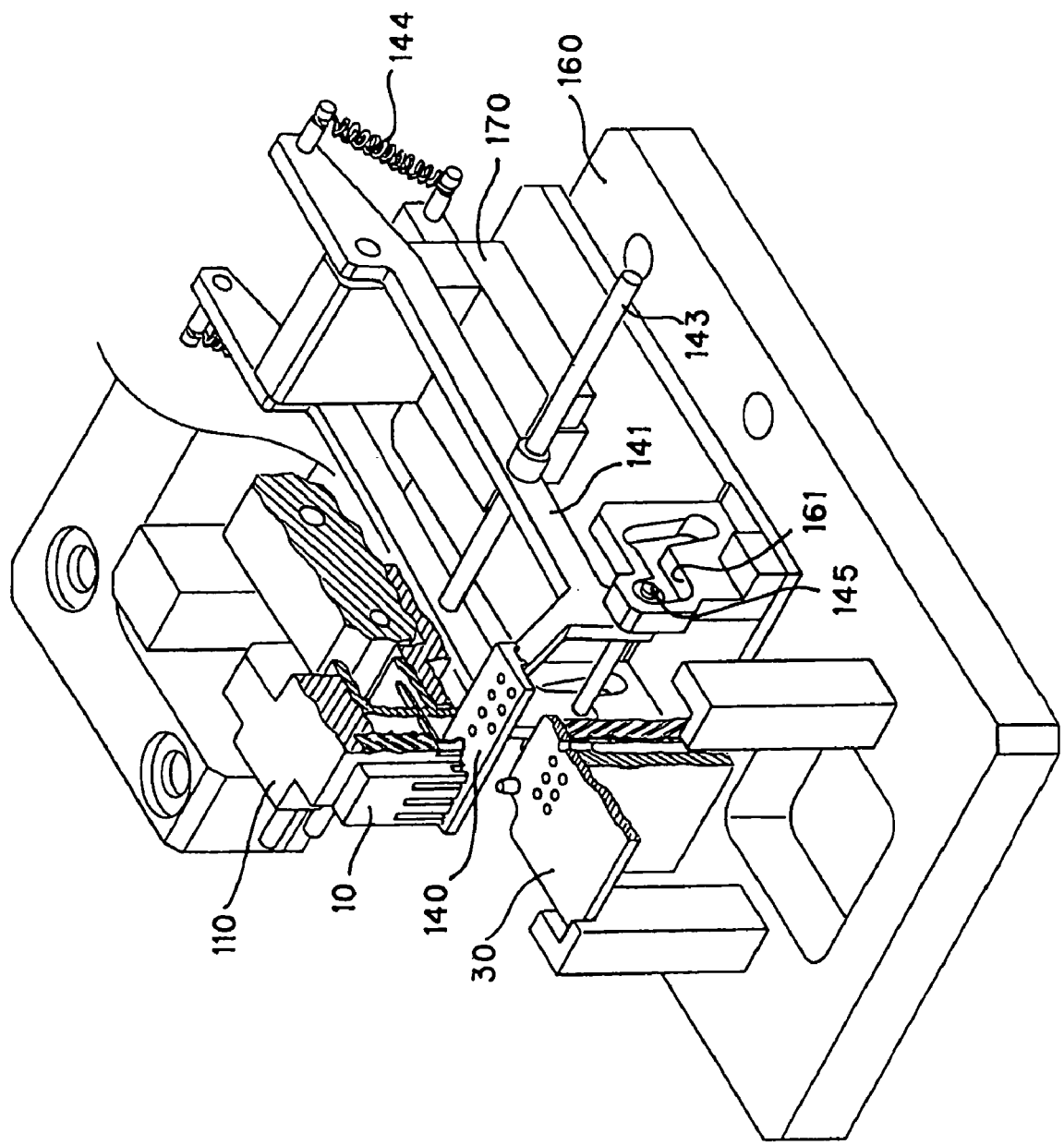
FIG. 10 is a partial sectional perspective view of the press-fitting apparatus of FIG. 5.

FIGS. 5 and 10 show the press-fitting head 10 after the press-fitting head 10 has been rotated from the rest position to the press-fitting position by the control lever 113. As the press-fitting head 10 is rotated from the rest position to the press-fitting position, the contacts 21, 22 of the connector 20 enter the vertical grooves 12 of the press-fitting head 10 so that the contacts 21, 22 are held in position.

Figure 6:
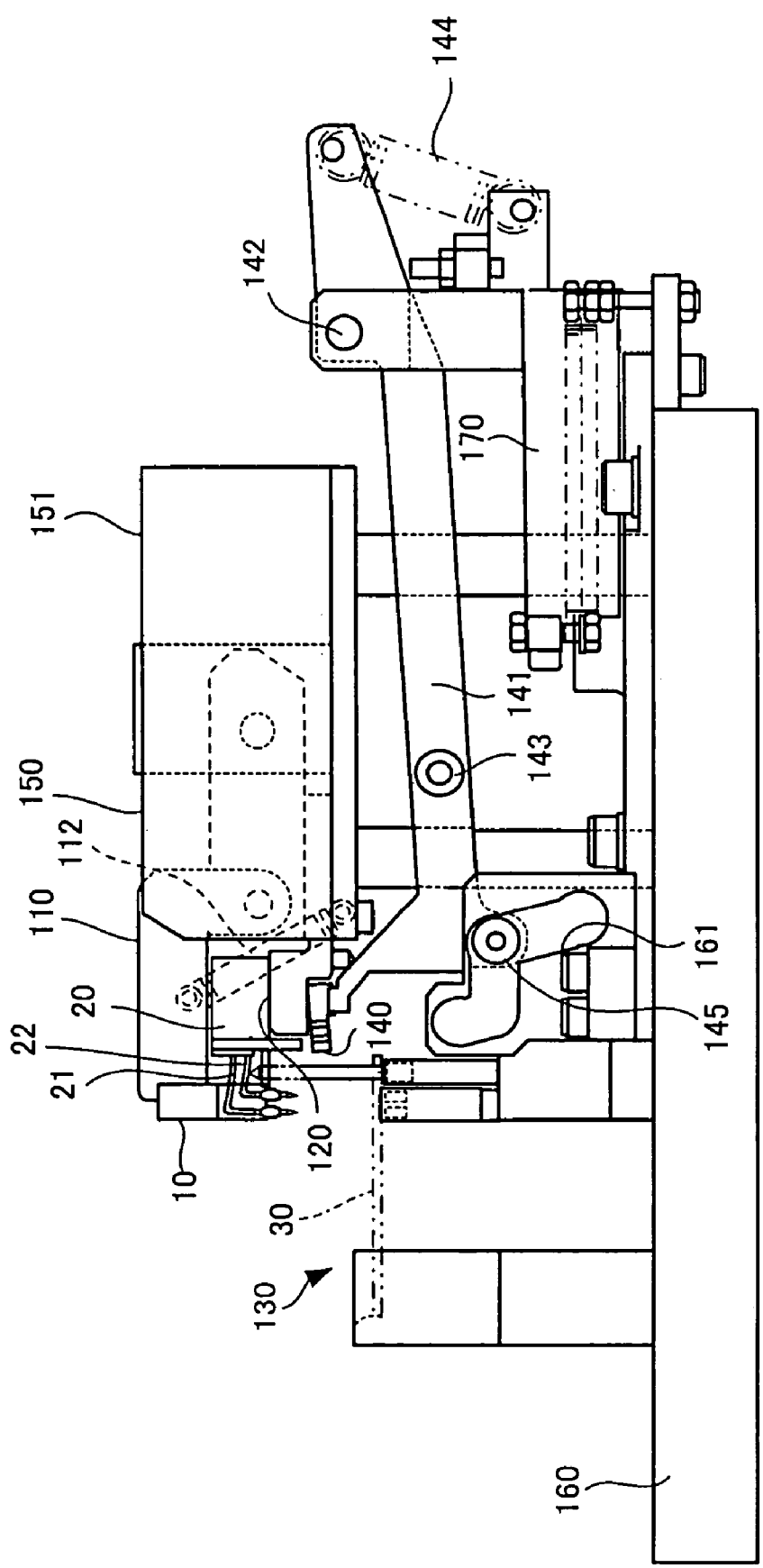
FIG. 6 is a side view of the press-fitting apparatus showing a step of the pressing operation.

When the press-fitting head 10 is in the press-fitting position, the link control lever 143 of the link 141 is operated to cause the cam pin 145 of the link 141 to move along the cam groove 161, as shown in FIG. 6. During transition from the state shown in FIG. 5 to the state shown in FIG. 6, the sliding board,170 slides to the right in FIG. 6 with respect to the base 160. The link 141 slides together with the sliding board 170 to move the cam pin 145 from the position shown in FIG. 5 to the position shown in FIG. 6. As the cam pin 145 of the link 141 moves along the cam groove 161, the alignment plate 140 retracts from the positioning site where it positions the contacts 21, 22 of the connector 20. Because the contacts 21, 22 of the connector 20 have already been positioned in the vertical grooves 12 of the press-fitting head 10, the contacts 21, 22 remain positioned when the alignment plate 140 retracts from the contacts 21, 22. The alignment plate 140 moves downward into abutment with a bottom surface of the connector mounting section 120.

Figure 7:
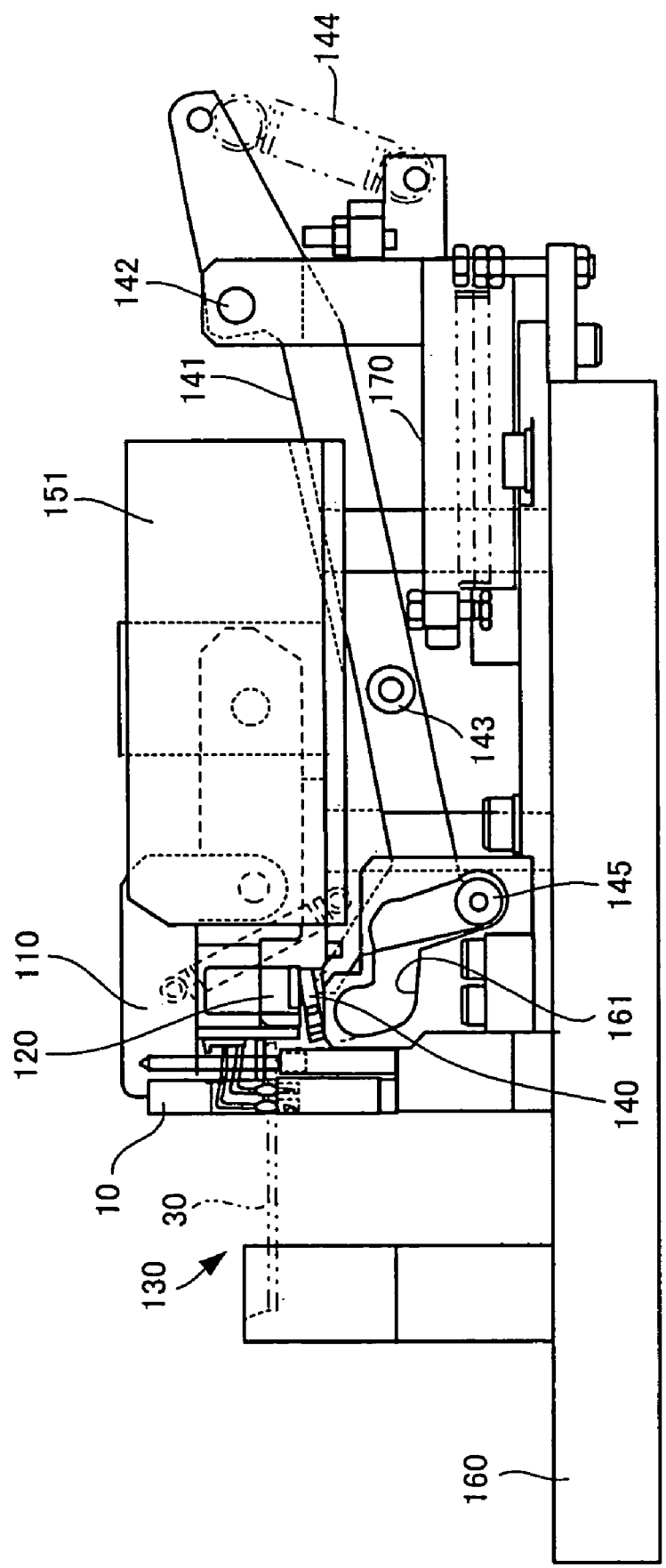
FIG. 7 is a side view of the press-fitting apparatus showing a step of the pressing operation.
Figure 11:
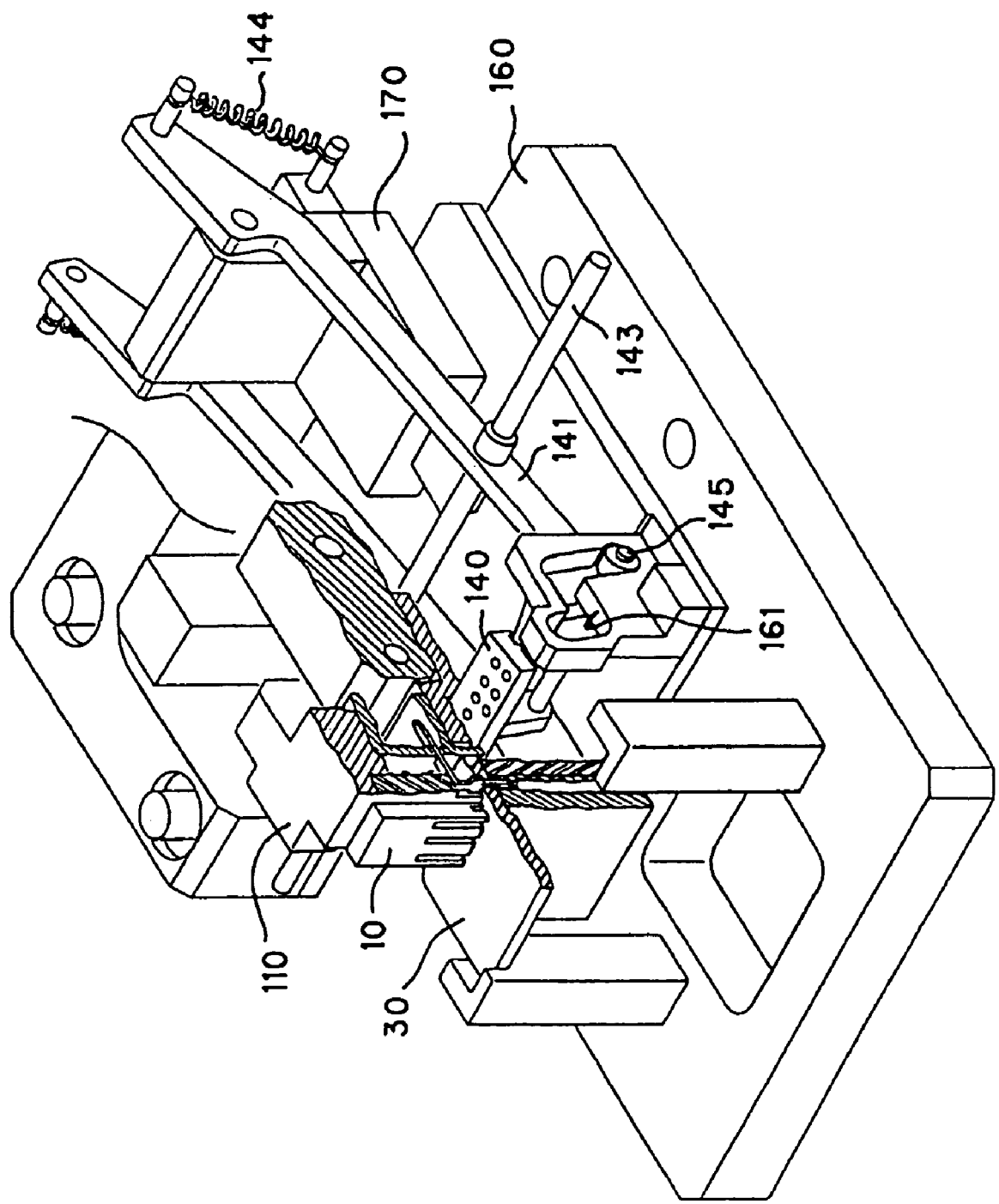
FIG. 11 is a partial sectional perspective view of the press-fitting apparatus of FIG. 7.

A top surface of the support arm 110 is then pressed downward by a known press-fit machine (not shown), which presses the top surface of the support arm 110 downward to press-fit the contacts 21, 22. FIGS. 7 and 11 show the support arm 110 after the support arm 110 has been pressed downward by the press-fit machine (not shown) and the upper base 151 has been locked into position. As shown in FIGS. 7 and 11, when the control lever 113 is pressed down, the support arm 110, support arm holder 150 which holds the support arm 110, press-fitting head 10 secured to the support arm 110, and the upper base 151 are pressed downward as a single unit. As the press-fitting head 10 moves downward, the abutment portions 13 of the press-fitting head 10 come into contact with the shoulders 21b, 22b of the contacts 21, 22 from above to press the contacts 21, 22 downward and, thereby, press-fit the press-fit portions 21a, 22a of the contacts 21, 22 into the press-fitting apertures 31 in the substrate 30. As the contacts 21, 22 are positioned with respect to the press-fitting apertures 31 in the substrate 30 by the first and second positioning walls 14, 15, the shoulders 21b, 22b of the contacts 21, 22 are prevented from slipping out from the abutment portions 13 of the press-fitting head 10 so that it is possible to reliably press-fit the press-fit portions 21a, 22a of the contacts 21, 22 into the press-fitting apertures 31 in the substrate 30.

Figure 8:
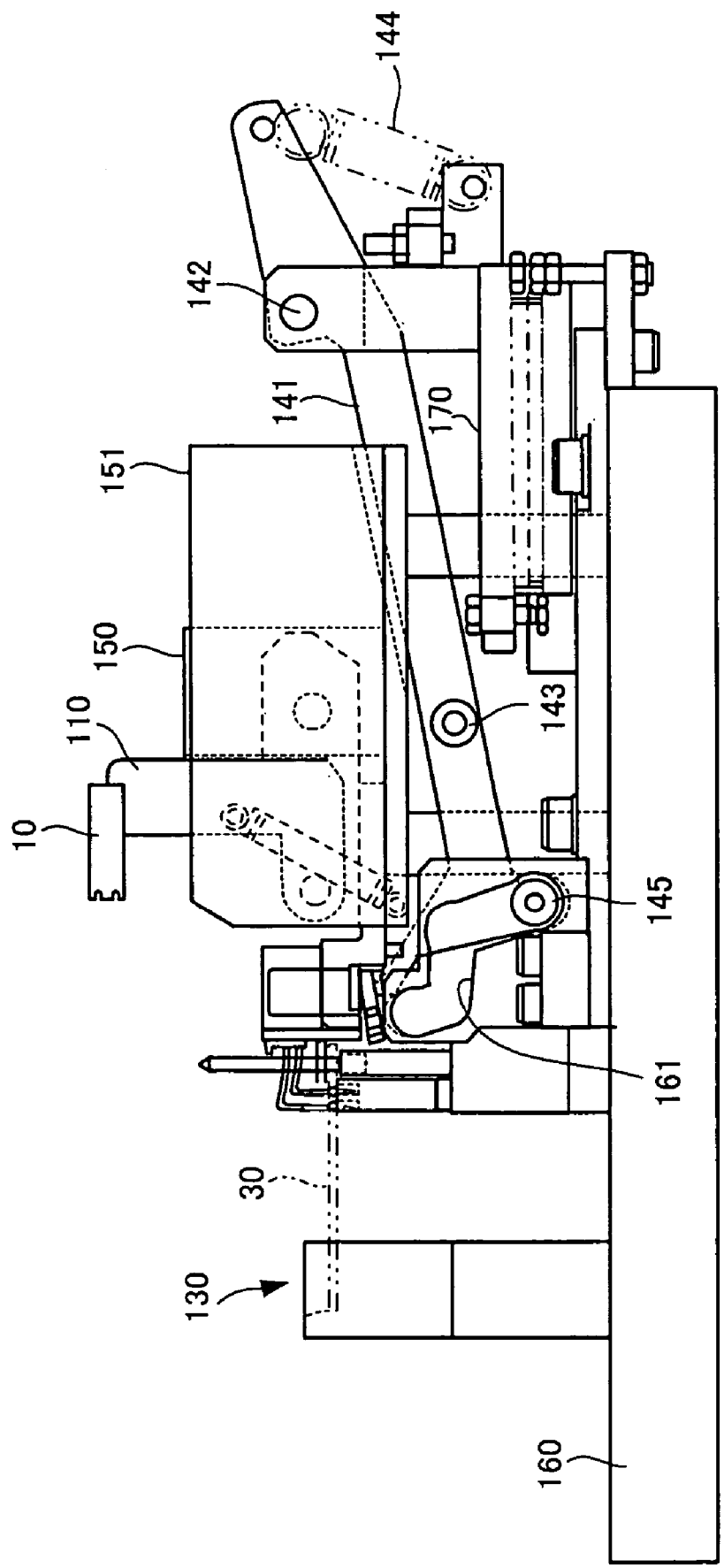
FIG. 8 is a side view of the press-fitting apparatus showing a step of the pressing operation.

After the press-fit machine (not shown) rises, the press-fitting head 10 is rotated to the rest position by the support arm 110, as shown in FIG. 8. The upper base 151 is unlocked and the support arm holder 150, the support arm 110 held by the support arm holder 150, the press-fitting head 10 secured to the support arm 110, and the upper base 151 move upward as a unit to the position shown in FIG. 3 by the coil spring 152 shown in FIG. 9. The link coil spring 144 and the operation of the link control lever 143 by the operator then return the link 141 to the position shown in FIG. 3, and the alignment plate 140 fastened to the tip of the link 141 returns to the positioning site. Alternatively, motor power or the like may be used instead of manual power to rotate the support arm 110 and move the link 141.

Figure 12:
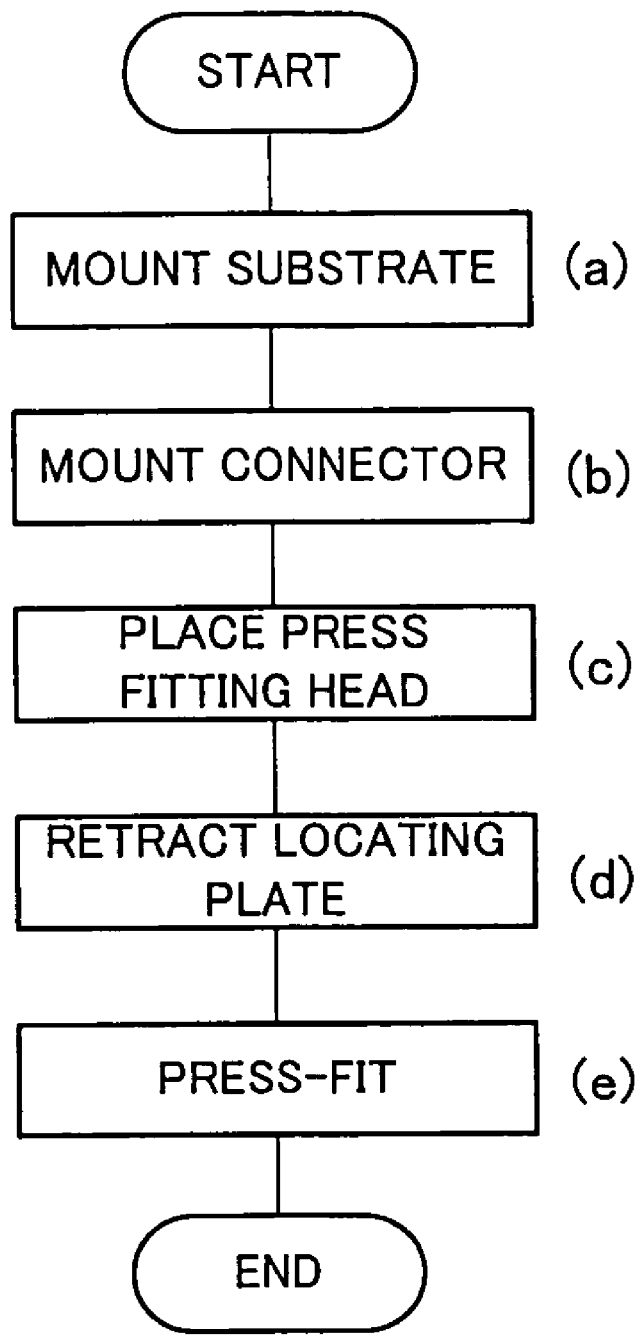
FIG. 12 is a flowchart of a press-fitting method according to the embodiment of the present invention.

FIG. 12 is a flowchart of the press-fitting method according to the embodiment of the present invention.

At step (a), a substrate 30 is mounted on the substrate mounting section 130, as shown in FIG. 3. At step (b), the connector 20 is mounted on the connector mounting section 120 after the L-shaped legs of the contacts 21, 22 of the connector 20 are aligned by being inserted into apertures in the alignment plate 140. At step (c), the press-fitting head 10 is positioned above the L-shaped legs of the contacts 21, 22 of the connector 20, as shown in FIG. 5. At step (d), the alignment plate 140 retracts from the positioning site. At step (e), the press-fitting head 10 is pressed downward such that the contacts 21, 22 of the connector 20 are press-fitted into the press-fitting apertures 31 in the substrate 30. The assembled substrate 30 and connector 20 are then removed, and the initial state shown in FIG. 3 is restored. Through repetition of this cycle, substrates with a connector press-fitted are completed one by one.

The apparatus according to the present invention is equipped with the alignment plate 140, which positions the lower end of the legs, allowing the contacts 21, 22 to be positioned relative to the press-fitting apertures 31 in the substrate 30. Since the alignment plate 140 is retractable from the positioning site, the alignment plate 140 can be retracted prior to actual press-fitting of the contacts 21, 22 into the substrate 30, which eliminates the need for a conventional terminal alignment plate. Additionally, the contacts 21, 22 are positioned by the alignment plate 140 before press-fitting and are held securely by the press-fitting head 10 so that the shoulders 21b, 22b of the contacts 21, 22 are prevented from slipping from the first and second positioning walls 14, 15. Consequently, the contacts 21, 22 are press-fitted into the substrate 30 more reliably. Thus, the press-fitting method according to the present invention enables reliable press-fitting, allows the alignment plate 140 to be reused repeatedly, eliminates the need for a conventional terminal alignment plate, and reduces costs.

We claim:

1. An apparatus for positioning and press-fitting press-fit portions of roughly L-shaped legs of contacts arranged in multiple rows in a connector into a substrate, comprising:
   a press-fitting head rotatable between a rest position and a press-fitting position, the press-fitting head having vertical grooves for receiving the contacts in the press-fitting position; and
   an alignment plate arranged proximate the press-fitting head at a positioning site, the alignment plate being retractable from the positioning site when the press-fitting head is in the press-fitting position; and
   a cam mechanism for retracting the alignment plate, the cam mechanism including a cam pin on a link attached to the alignment plate and a cam groove on a member attached to a base of the apparatus.

2. The apparatus of claim 1, further comprising a substrate mounting section and a connector mounting section.

3. The apparatus of claim 1, wherein the vertical grooves include abutment portions and first and second positioning walls, the abutment portions extending substantially perpendicular to the vertical grooves for abutting shoulders of the contacts, and the first and second positioning walls being formed below the abutment portions and extending substantially perpendicular thereto for positioning the shoulders of the contacts in a right-left and forward-rearward direction.

4. The apparatus of claim 1, wherein the press-fitting head is mounted to a support arm.

5. The apparatus of claim 4, wherein the support arm has a manually operated control lever for rotating the press-fitting head between the rest position and the press-fitting position.

6. The apparatus of claim 4, further comprising a coil spring attached to the support arm that stabilizes the press-fitting head.

7. The apparatus of claim 1, wherein the link includes a link control lever for retracting the cam pin in the cam groove.

8. The apparatus of claim 7, further comprising a link coil spring.

9. The apparatus of claim 1, wherein the link has a manually operated link control lever for retracting the alignment plate.

10. The apparatus of claim 9, further comprising a link coil spring attached to the link.

* * * * *